Jan. 3, 1961 B. COLTEN ET AL 2,967,276

ELECTRICAL PULSE MANIPULATING APPARATUS

Filed Aug. 1, 1956 2 Sheets-Sheet 1

INVENTOR.
BERNARD COLTEN
ROY W. REACH, JR.
BY Henry L. Hanson
ATTORNEY

ELECTRICAL PULSE MANIPULATING APPARATUS

Filed Aug. 1, 1956 2 Sheets-Sheet 2

INVENTOR.
BERNARD COLTEN
ROY W. REACH, JR.
BY Henry L. Hanson
ATTORNEY

United States Patent Office 2,967,276 Patented Jan. 3, 1961

2,967,276

ELECTRICAL PULSE MANIPULATING APPARATUS

Bernard Colten, Waltham, and Roy W. Reach, Jr., Sudbury, Mass., assignors, by mesne assignments, to Minneapolis-Honeywell Regulator Company, a corporation of Delaware Filed Aug. 1, 1956, Ser. No. 601,477

3 Claims. (Cl. 328—92)

A general object of the present invention is to provide a new and improved pulse handling circuit for use in an apparatus for the control of signal pulses which are representative of information or control conditions. More specifically, the present invention is concerned with a pulse handling circuit for an electronic data processing machine employing pulse signal circuits for use in the operation and control of the data processing machine wherein the circuitry employed is characterized by its making maximum use of standard circuitry in order to improve the over-all circuit efficiency and thereby minimize the circuitry required without impairing over-all circuit functioning.

In an article entitled "Packaged Logical Circuitry for a 4 mc. Computer" by Norman Zimbel, printed in the "Convention Record of the I.R.E.," 1954 National Convention, part IV, there is disclosed a representative form of logical package which is adapted for use in a data processing machine. The packages disclosed in the Zimbel article are packages where a plurality of signals are brought together through a common logical circuit package to produce on the output of the logical package a control pulse indicative of selected combinations of input functions. The input functions normally applied to the logical packages in a computer are functions of a pulse nature and these functions may be suitably gated together so that when there exists a predetermined combination of pulses, an output pulse from the selected gate will be applied to a reshape amplifier which will produce a pulse on the output thereof which may be used for some additional informational or control purpose. The logical packages are conventionally made up of a single amplifier having on the input thereof a gating circuit with a plurality of gate legs. Each gate leg of the logical package incorporates an asymmetrically conducting device such as a crystal diode which is adapted to co-operate with the other gating circuitry to selectively control the output of the gating circuit. In order for any particular gating circuit to pass a control signal, it is essential that all of the input gate legs thereto have an active signal applied. Depending upon the polarities of the signal sources connected to the gating circuits, the active signal on each of the gate legs must be a positive or a negative signal.

When diodes are used in the gate legs of the gating circuits, it has been found that there is a physical limitation to the number of diodes that can be used in any one gating circuit and still achieve a usable control signal on the output of the associated amplifier. This physical limitation is imposed in part by the fact that the diodes presently available do not have a zero forward impedance and can not act as perfect clamping diodes.

In order to gate a large number of functions together, it has been necessary in the past to provide a separate logical package for each set of functions with the maximum for any one particular package being less than the total number of functions to be handled. Thus, if there were twenty-two functions to be gated together, it would be essential to provide at least three logical packages connected to operate in series with each having an input of eight functions, assuming that eight functions represents the maximum that any one particular gate structure can accommodate. The necessity for providing three logical packages in a circuit of this type necessarily increases the amount of equipment required and further increases the amount of equipment where a circuit failure might occur, thereby increasing the maintenance problem on the over-all system circuitry.

The present invention has a more specific object, a means for increasing the over-all efficiency of a single logical package used in a data processing machine.

The foregoing object of the invention is achieved by a unique arrangement of a plurality of gates co-operating with a single re-shape amplifier where each of the gates of the plurality are activated in time sequence so that there is in effect a time sharing of the reshape amplifier to thereby minimize the circuit requirements insofar as pulse reshaping and amplification are concerned. This time sharing is achieved by arranging a plurality of gating circuits on the input of a reshape amplifier so that each may be activated at a separate time interval by a programmed timing pulse so that the output of the reshape amplifier at any particular instant is representative of the output of the time selected gate. In order to combine the functions over several gating circuits in a single logical package, the output of the package is recirculated to selected ones of the input gating sections so that the output of any one gating section at a selected time interval will be representative of all of the functions that have been gated together in the gating sections previously actuated as well as the functions gated into the selected gate.

It is, therefore, a more specific object of the present invention to provide a new and improved gating structure for a plurality of functions wherein there are provided a plurality of gating sections, each adapted to be actuated in time sequence on the input of a pulse reshape amplifier.

A still further more specific object of the present invention is to provide a new and improved multiple gate section logical package wherein the information pulse on the output of the logical package is recirculated to selected ones of the input gate sections and said gate sections are adapted to be rendered active in time sequence so that there is a time sharing of the input of the reshape amplifier of the package with a plurality of input gate sections.

The principles of the present invention are applicable to the control of a plurality of gates wherein a plurality of functions are gated or to the control of a dynamic type logical circuit wherein an oscillatory condition exists in the logical package and wherein the dynamic condition may be reset by any one of a large number of functions which are adapted to be effective on the associated gating circuits on a time sharing basis.

It is, therefore, another more specific object of the present invention to provide a new and improved logical circuit having a plurality of recirculation paths each of which are associated with a separate gating section on the input of the logical package wherein the gating sections are sequentially activated on a time sharing basis.

The various pieces of novelty which characterize the invention are pointed out with particularity in the claims annexed to and forming a part of this specification. For a better understanding of the invention, its advantages, and specific objects obtained with its use, reference should be had to the accompanying drawings and descriptive matter in which there is illustrated and described a prefered embodiment of the invention.

In considering the circuitry described hereinafter, it should first be noted that each of the logical packages used takes a predetermined amount of time in order to pass a pulse from the gate to the output of the reshape amplifier. The amount of time that any particular logical package takes in order to transmit a pulse is generally fixed to a selected time which is consistent with the rate at which information pulses are being utilized in the associated data processing machine. Thus, if the associated data processing machine is a serial type machine wherein the information is represented by a series of pulses, the timing between individual pulses of information of a corresponding character is referred to as a pulse period. The delay in any particular logical package is generally selected to be equivalent to one pulse period.

Figure 1:
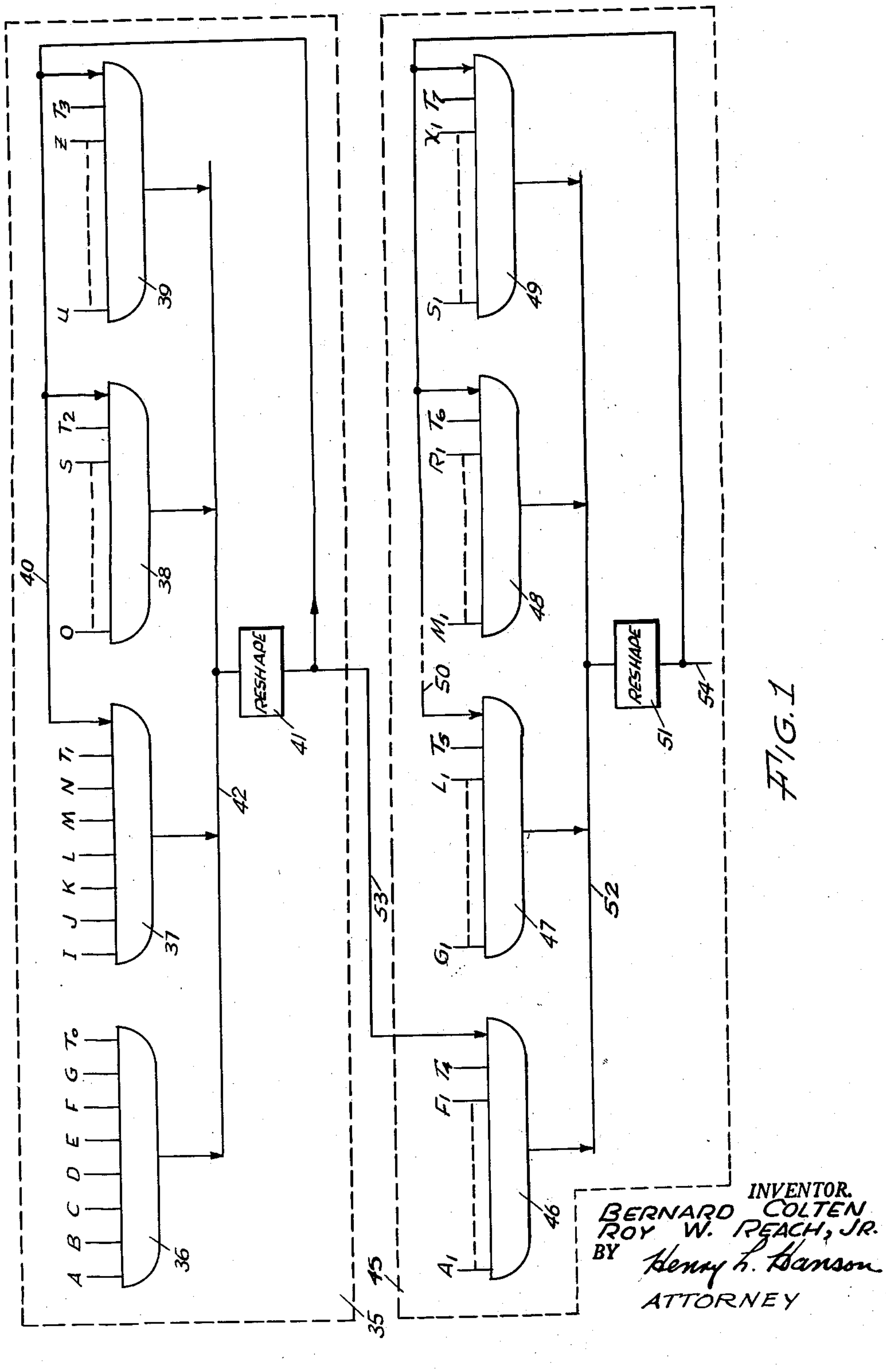
Figure 1 is a diagrammatic showing of the logical structure of the present invention wherein a plurality of variables are gated together.

As shown in Figure 1, the gating of a large number of variables is accomplished by a logical package circuit built upon a time sharing principle. In Figure 1 there are shown two logical packages 35 and 45. The logical package 35 includes a plurality of gating sections 36, 37, 38, and 39. While four gating sections have been shown, the number of gating sections may be increased beyond this number. In one embodiment of this invention, it was found that six gating sections worked satisfactorily in a single package. Each of the individual gating sections 36—39 may have up to eight input gate legs. The gate 36 has eight input gate legs which are connected to respond to eight separate functions which are to be gated together, one of which may be a timing pulse at time $T_0$. The gate section 37 has eight input gate legs, six of which are adapted for connection to a variable function; the seventh of which is adapted to be connected to a suitable clock pulse source $T_1$; and the eighth of which is adapted to be connected to a recirculation line 40 which is energized by the output of a reshape amplifier 41. The reshape amplifier 41 has for its input the outputs of the gate sections 36, 37, 38, and 39 buffered together on a buffer line 42.

The gate section 38 has a plurality of input function gate legs O through S, a timing input gate leg $T_2$ and a recirculation input gate leg also connected to the recirculation line 40. The gating section 39 has connected to the gate legs thereof input variables U through Z, a timing pulse $T_3$, and a recirculation pulse from the recirculation line 40.

The logical package 45 is formed in the same general way as the logical package 35 and incorporates a plurality of gating sections 46 through 49. The input for the gating section 46 is derived from the output of the reshape amplifier 41 of logical package 35 by way of lead 53. This input is gated together with a plurality of functions $A_1$ through $F_1$ and a timing pulse $T_4$. The gating section 47 has a similar construction with variable functions $G_1$ through $L_1$ on separate gate legs, a timing pulse $T_5$ on a further gate leg, and a recirculation pulse on another gate leg. The recirculation pulse is derived from a recirculation line 50 which is connected to the output of a reshape amplifier 51. The input of the reshape amplifier is derived from the outputs of the gate sections 46 through 49 which are buffered together on the buffer line 52.

Considering the operation of the circuit shown in Figure 1, it is assumed that the transit time of a pulse through the logical package from one input gate leg to the output of the reshape amplifier is a fixed amount and will be referred to as a pulse period. It is further assumed that there is available a timed pulse signal generator or clock which is capable of producing timed pulses where the time interval between the pulses is equivalent to the aforementioned pulse period. It is further assumed that the functions which are to be gated together are available at selected time intervals and are of sufficient duration to insure coincidence between the respective functions to be gated and the timing pulses used in the circuit.

When the functions A through G are present on the input of the gate section 36 of the package 35 at time $T_0$ there will be produced a pulse on the output buffer line 42 which will be applied to the reshape amplifier 41. The output of the reshape amplifier, one pulse period later, will appear on the recirculation line 40 and is fed back to a gate leg on each of the gate sections 37, 38 and 39. Since the pulse originating from the gate section 36 occurs initially at time $T_0$, the pulse appearing on the output of the reshape amplifier 41 will appear one pulse period later at time $T_1$.

When the recirculation pulse appears at time $T_1$ on the recirculation line 40, it will be effective to activate the recirculation gate leg of the gating section 37. If each of the functions I through N are active, and there is a timing pulse $T_1$, the gate section 37 will open and a pulse will appear on the buffer line 42. This pulse will again be fed through the reshape amplifier 41 and will appear on the output of the reshape amplifier at time $T_2$. Once again, the pulse will be fed back on the recirculation line 40 and this time will be effective on the gate section 38. If each of the variables O through S are active and the timing pulse $T_2$ is active, there will be an output from the gate section 38 on the buffer line 42. This output will be amplified by the reshape amplifier 41 and will appear on the recirculation line 40 at time $T_3$. This recirculation will continue on gate section 39 when the functions U through Z and timing pulse $T_3$ is present.

After the gate section 39 of the logical package 35 has passed its output pulse through the reshape amplifier 41, the output for the reshape amplifier 41 will have no further output from any of the gate sections of the package 35 due to the lack of a coincidence between the timing pulses and the pulse on the recirculation line. However, the output of the reshape amplifier 41 will be fed to one of the input gate legs of the gate section 46 of the logical package 36 by way of lead 53. The gate section 46 will produce an output when there is coincidence between the input functions $A_1$ through $F_1$, the timing pulse $T_4$ and the pulse of the reshape amplifier 41. When there is an output from the gate section 46, this will appear on the buffer line 52 and will be applied to the input reshape amplifier 51 which will produce at its output, one pulse period later at time $T_5$, a pulse which is adapted to be applied to the recirculation line 50.

The next gate section in the series to be activated is gate section 47. Here the gate legs $G_1$ through $L_1$, if active at the same time that the timing pulse $T_5$ occurs and at the time that a recirculation pulse on line 50 occurs, will open gate 47 so that a pulse will appear on the output buffer line 52 at time $T_6$. With an output pulse on the buffer line 52, the reshape amplifier will again reproduce the same one pulse period later so that on the recirculation line 50 there will appear a further signal which is adapted to condition the next gate section in the series in the package. The next gate section is assumed to be section 48. If there is a coincidence between the functions $M_1$ through $R_1$ at time $T_6$, the gate section 48 will open upon the occurrence of the recirculation pulse and again there will be an output on the buffer line 52 which will be fed to the reshape amplifier 51. The reshape amplifier 51 will again have an output pulse which is recirculated to the next gate section in the series which is shown in the drawing to be the gate section 49. Here, if there is coincidence between the recirculation pulse and the timing pulse $T_n$ as well as coincidence with the input functions $S_1$ through $X_1$, there will be a pulse on the output of the gate section 49 for application to the reshape amplifier 51. The output of the reshape amplifier this time will be on the output line 54 where it is adapted for use in further gating circuitry or for use elsewhere in the associated pulse handling circuitry.

It will be readily apparent from a review of Figure 1 that each logical package has been arranged so that a plurality of individual gating sections are sequentially activated by means of a recirculation pulse and a timing pulse to permit the gating of a number of variables considerably in excess of the number of variables that can be handled in any one gating section and that this has been accomplished without the necessity of several logical packages as required in the circuits, heretofore known. While four gating sections are shown for each package, the number of gating sections may be increased. In such event, the timing pulses must be arranged so that the gates are opened in time sequence. It will be readily apparent that the number of logical packages that may be connected in series in the manner shown in Figure 1 is without limit insofar as workability is concerned and that any number of functions may be gated together in this manner.

The functions gated together in Figure 1 may well be in the form of pulses or signal potentials representative of the particular function which is to be gated. The functions may be all assertions or negations or combinations thereof as necessary to produce the desired output controlling action. It will be readily apparent that if any one of the functions in either of the two logical packages 35 or 45 is lacking, there will be no output pulse on the output of the reshape amplifier 51 on the output line 54.

Figures 2, 3:
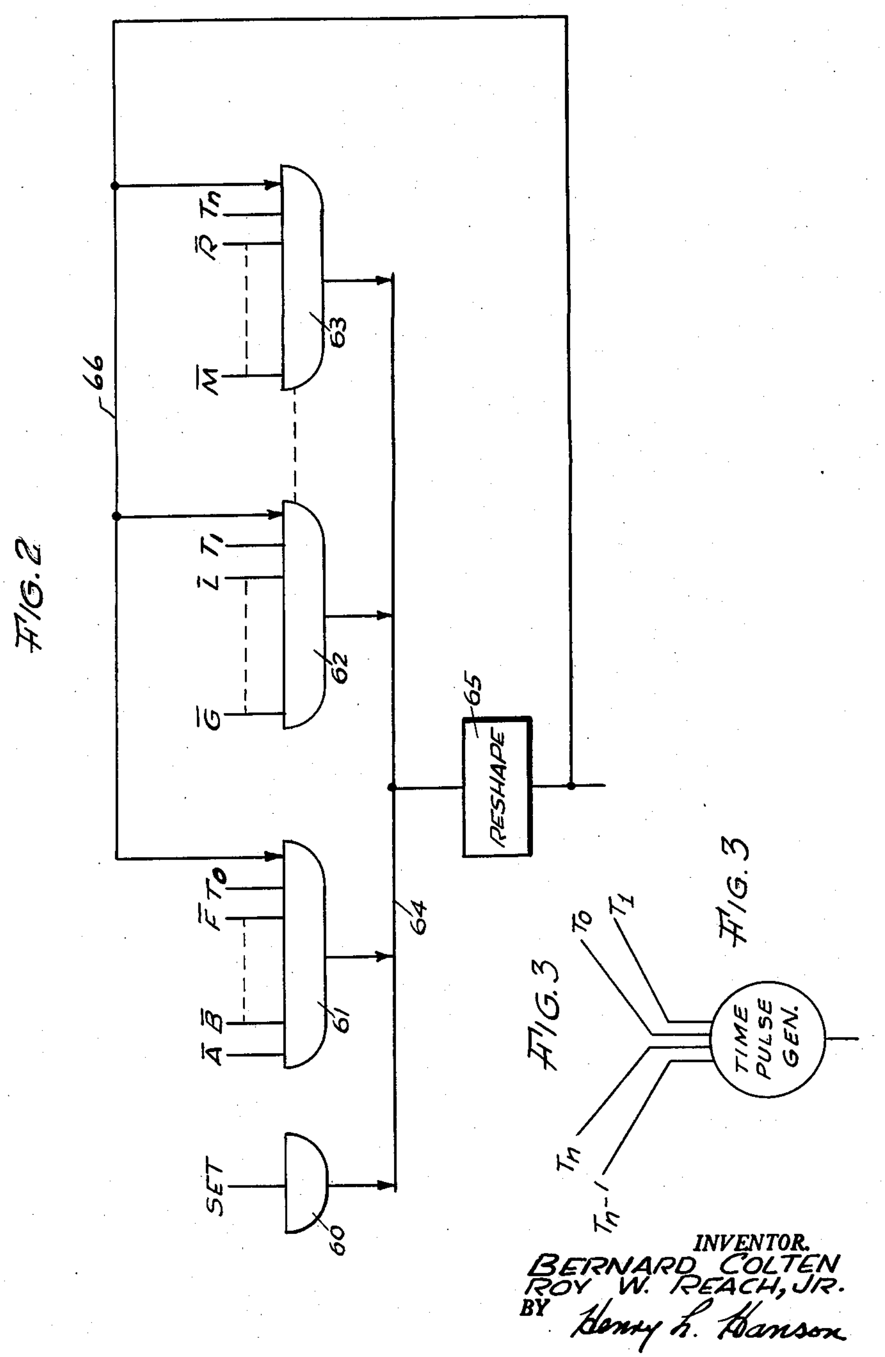
Figure 2 is a diagrammatic showing of a dynamic recirculating logical package incorporating the principles of the present invention.
Figure 3 is a diagrammatic showing of a time pulse generator adapted to be used in the circuits of Figures 1 and 2.

In Figure 2 there has been shown the principles of time sharing among gates on a logical package applied to a package which is adapted for continuous pulse recirculation. This type of logical package is sometimes referred to as a dynamic flip-flop in that the package will be oscillating to indicate one stable state and not oscillating to indicate a second stable state. The signal in a dynamic flip-flop is actually a series of pulses which are recirculated through the package and the circulation may be cancelled by closing one of the recirculation gates associated with the circuit.

As shown in Figure 2, the logical package comprises an input or set gate 60 and a plurality of recirculation gates 61, 62, and 63. The set gate 60 is shown with a single input line while the gates 61, 62 and 63 are shown with a plurality of input gate legs, one of which is connected to a suitable timing pulse signal source. The output of each of the gate sections are buffered together on a buffer line 64 which is connected to the input of a reshape amplifier 65. The output of the reshape amplifier is connected to a recirculation line 66 and thereby to the recirculation gate legs of each of the gating sections 61, 62 and 63.

In considering the operation of Figure 2, it is assumed that the gate legs of each of the gate sections 61, 62, and 63 which are connected to functions which are monitoring the operation of the package are negations so that the gate sections will be open if there is coincidence between the timing pulse on the timing gate leg, the negation, and the recirculation pulse from the recirculation line 66. Thus, if a set pulse is applied through the set gate 60, the resultant pulse will appear on the buffer line 64 and therefore on the input of the reshape amplifier 65. The output of the reshape amplifier 65 will have a pulse on the output thereof one pulse period after it was applied to the input set line on the gate 60. This time is assumed to be time $T_0$. The recirculation pulse on line 66 will be applied to the gate section 61 where there will be coincidence between the timing pulse $T_0$, the timing gate leg of the section, and the recirculation pulse. If each of the variables $\bar{A}$ through $\bar{F}$ are active, the gate section will be open and the pulse will be fed through the gate section to the buffer line 64. Once again it will be applied to the reshape amplifier 65 and, one pulse period later, at time $T_1$, the recirculation pulse will appear on the line 66 and be applied to the gate section 62. With the functions $\bar{G}$ through $\bar{L}$ each appearing as active negations, and with the timing pulse $T_1$, the gate 62 will be open and once again the pulse will be recirculated through the reshape amplifier 65. Finally, the pulse on the recirculation line 66 will be applied to the gate section 63 where it will appear in time coincidence with the timing pulse $T_n$ on the timing leg of the section 63. With the negations active in the input functions $\bar{M}$ through $\bar{R}$ present on the other input gate legs of the section, the section 63 will be open and therefore apply an output pulse to the reshape amplifier 65.

This logical package is arranged so that from the timing standpoint the timing pulses $T_0$, $T_1$, and $T_n$ are continuously recurring pulses in that order, where the $n$ is determined by the number of gate sections used. As shown in Figure 2, the $n$ will be equal to Z indicating three gate sections are used. With the gate sections 61 through 63 sequentially actuated and with all of the negation functions being active, it will be impossible to reset or stop the oscillation of the package. However, should a negation appear on one of the function gate legs of any of the gate sections so that that gate leg is inactive at the time interval that that gate section is conditioned to be active, the gate section will not be open and no pulse will appear on the output buffer line 64 and consequently there will be no pulse for recirculation to the reshape amplifier 65. When the package is in a non-oscillating state, it is considered to be in the reset state. To put the logical package back into oscillation again, it is necessary to apply an input set pulse to the set gate 60 after which the recirculation will continue until once again a reset condition occurs on one of the function gate legs of the packages 61, 62 and 63.

The arrangement of Figure 2 is another arrangement for considerably simplifying the amount of circuitry required in a dynamic flip-flop. In circuits of this type, known in the prior art, a separate package has been required in order to clear or reset the oscillating condition when the number of functions have been greater than a predetermined amount and consequently the present arrangement accomplishes the same end result with a single logical package while permitting resulting control by a large number of functions.

Shown in Figure 3 is a schematic time pulse generator which is adapted to produce in time sequence a series of pulses, the pulse first appearing at time $T_0$, then at time $T_1$, and then at as many time positions as the time pulse generator is built to supply up to a number $T_n$. In Figure 1, the number of timing pulses $T_n$ will be equal to or greater than the number of gating sections in any one package. In Figure 2, the number of timing pulses will be determined by the number of reset gates used. The time pulse generator may take several forms well known in the art such as a pulse generator which feeds a delay line having a plurality of taps thereon with the taps being spaced at desired time interval separations.

From the foregoing it will be readily apparent there has been provided a new and improved logical circuitry which is adapted to utilize a plurality of gate sections which are rendered effective on a time sharing basis. Further, it will be readily apparent that this form of circuitry is particularly adapted for minimizing the overall circuit configurations required as well as the amplifier circuitry essential in the gating circuits.

While, in accordance with provisions of the statutes, there has been illustrated and described the best form of the invention known, it will be apparent to those skilled in the art that changes may be made in the form of the apparatus disclosed without departing from the spirit of the invention as set forth in the appended claims, and that in some cases, certain features of the invention may be used to advantage without a corresponding use of other features.

Having now described the invention, what is claimed is new and for which it is desired to secure by Letters Patent is:

1. Apparatus for gating a plurality of separate information signals in a single time-shared logical package comprising a single pulse amplifier having an input and an output, a plurality of input data signal gating sections, each of said gating sections having a plurality of separate information signal inputs, a single timing signal input and a single output connected to the input of said amplifier, a timing signal source having a plurality of separate outputs with sequentially occurring discrete time-spaced and non-overlapping pulses thereon, circuit means connecting separate ones of said timing signal source outputs to separate ones of said timing signal inputs of said gating sections so that each of said gating sections will be activated in a predetermined and distinctly separate time sequence, and means connecting the output of said amplifier to an input on selected ones of said input gating sections.

2. Apparatus for gating a plurality of separate information signals in a single time-shared logical package comprising a single pulse amplifier having an input and an output and a predetermined signal transfer time, a plurality of input signal gating sections, each of said gating sections having a plurality of separate information signal inputs, a single timing signal input and a single output connected to the input of said amplifier, a timing signal source having a plurality of separate outputs with sequentially occurring discrete time-spaced and non-overlapping pulses thereon, said pulses being spaced in accordance with said transfer time, circuit means connecting separate ones of said timing signal source outputs to separate ones of said timing signal inputs of said input gating sections so that each of said input gating sections will be activated in a predetermined and distinctly separate time sequence, and means connecting the output of said amplifier to an input on selected ones of said input gating sections.

3. Apparatus for gating a plurality of separate information pulse signals in a single time-shared logical package comprising a single pulse amplifier having an input and an output, a plurality of input pulse gating sections, each of said gating sections having a plurality of separate information pulse signal inputs, a single timing pulse signal input and an output connected to the input of said amplifier, a timing signal source having a plurality of separate outputs with sequentially occurring discrete time-spaced and non-overlapping timing pulses thereon, circuit means connecting separate ones of said outputs to separate ones of timing signal inputs of said gating sections so that said input gating sections will be activated in a predetermined and distinctly separate time sequence, and means connecting the output of said amplifier to an input on selected ones of said input gating sections so that each of said selected gating sections will be activated only when said amplifier has an output pulse signal.

References Cited in the file of this patent

UNITED STATES PATENTS

| | | |
|---|---|---|
| 2,651,718 | Levy | Sept. 8, 1953 |
| 2,674,727 | Spielberg | Apr. 6, 1954 |
| 2,705,795 | Fisk et al. | Apr. 5, 1955 |
| 2,712,065 | Elbourn et al. | June 28, 1955 |
| 2,748,269 | Slutz | May 29, 1956 |
| 2,807,716 | Steele | Sept. 24, 1957 |
| 2,835,801 | Haueter | May 20, 1958 |
| 2,901,605 | Raymond et al. | Aug. 25, 1959 |

OTHER REFERENCES

"Symbolic Logic, Binary Calculation, and 3C–PACs," by Robert W. Brooks, a monograph, copyrighted 1955 by Computer Control Company Inc. (15 pages; Fig. 11, page 10).